US006348139B1

(12) United States Patent
Shah et al.

(10) Patent No.: US 6,348,139 B1
(45) Date of Patent: *Feb. 19, 2002

(54) TANTALUM-COMPRISING ARTICLES

(75) Inventors: Ritesh P. Shah, Liberty Lake; Vladimir Segal, Veradale, both of WA (US)

(73) Assignee: Honeywell International Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,760

(22) Filed: Jun. 17, 1998

(51) Int. Cl.[7] ............................................. C23C 14/34

(52) U.S. Cl. ........................... 204/298.13; 204/298.12; 148/422; 420/427

(58) Field of Search ...................... 204/298.12, 298.13; 428/577, 662; 420/427; 148/422

(56) References Cited

U.S. PATENT DOCUMENTS

| | | | |
|---|---|---|---|
| 4,525,417 A | 6/1985 | Dimigen et al. | 428/244 |
| 4,619,695 A | * 10/1986 | Oikawa et al. | 75/65 EB |
| 4,663,120 A | 5/1987 | Parent et al. | 419/10 |
| 4,762,558 A | 8/1988 | German et al. | 75/246 |
| 4,842,706 A | 6/1989 | Fukasawa et al. | 204/298 |
| 4,889,745 A | 12/1989 | Sata | 427/12 |
| 4,960,163 A | 10/1990 | Fang et al. | 164/459 |
| 5,074,907 A | 12/1991 | Amato et al. | 75/235 |
| 5,087,297 A | 2/1992 | Pouliquen | 148/2 |
| 5,282,946 A | 2/1994 | Kinoshita et al. | 204/298.13 |
| 5,330,701 A | 7/1994 | Shaw et al. | 419/10 |
| 5,400,633 A | 3/1995 | Segal et al. | 72/272 |
| 5,418,071 A | 5/1995 | Satou et al. | 428/552 |
| 5,468,401 A | 11/1995 | Lum et al. | 252/22 |
| 5,508,000 A | 4/1996 | Satou et al. | 419/31 |
| 5,513,512 A | 5/1996 | Segal | 72/253.1 |

(List continued on next page.)

FOREIGN PATENT DOCUMENTS

| | | | |
|---|---|---|---|
| EP | 590904 | * 4/1994 | C23C/14/34 |
| JP | 610107 | 1/1994 | C22F/1/18 |
| JP | 693400 | 1/1994 | C22F/1/18 |
| JP | 6256919 | 1/1994 | C22F/1/18 |
| JP | 6-264232 | * 9/1994 | C23C/14/34 |
| JP | 08232061 | 6/1996 | |
| JP | 08269701 | 10/1996 | |
| WO | WO 87/07650 | 12/1987 | |
| WO | 92/01080 | * 1/1992 | C23C/14/34 |
| WO | WO 99/66100 | 12/1999 | C23C/14/34 |
| WO | WO 0/31310 | 6/2000 | C22B/34/24 |

OTHER PUBLICATIONS

English Translation of JP 6–264232, Sep. 20, 1994.*
Klein, C. "Manual Of Mineralogy", pp. 39–40, 1985.*
S. Wright et al., "Effect of Annealing Temperature on the Texture of Rolled Tantalum and Tantalum–10 Wt.% Tungsten", Tungsten and Refractory Metals, 1994, pp 501–508.
H–R Wenk, "Preferred Orientation in Deformed Metals and Rocks: An Introduction to Modern Texture Analysis", 1985, pp 9–11.
B.D. Cullity, "Structure of Polycrystalline Aggregates", Elements of X–Ray Diffraction Second Edition, 1978, pp 295–297.

*Primary Examiner*—Nam Nguyen
*Assistant Examiner*—Steven H. Ver Steeg
(74) *Attorney, Agent, or Firm*—Wells, St. John, Roberts, Gregory & Matkin, P.S.

(57) ABSTRACT

Described is the production of a metal article with fine metallurgical structure and texture by a process that includes forging and rolling and control of the forging and rolling conditions. Also described is a metal article with a minimum of statically crystallized grain size and a uniform (100) cubic texture.

15 Claims, 3 Drawing Sheets

U.S. PATENT DOCUMENTS

| | | | |
|---|---|---|---|
| 5,590,389 A | 12/1996 | Dunlop et al. | 419/67 |
| 5,600,989 A | 2/1997 | Segal et al. | 72/253.1 |
| 5,608,911 A | 3/1997 | Shaw et al. | 419/45 |
| 5,673,581 A | 10/1997 | Segal | 72/184 |
| 5,693,203 A * | 12/1997 | Ohhashi et al. | 204/298.12 |
| 5,772,860 A | 6/1998 | Sawada et al. | 204/298.13 |
| 5,780,755 A | 7/1998 | Dunlop et al. | 75/249 |
| 5,798,005 A | 8/1998 | Murata et al. | 148/421 |
| 5,809,393 A | 9/1998 | Dunlop et al. | 419/61 |
| 5,993,575 A | 11/1999 | Lo et al. | 148/577 |
| 5,993,621 A | 11/1999 | Liu | 204/298.12 |

* cited by examiner

TANTALUM-COMPRISING ARTICLES

The invention relates to metal articles with fine uniform structures and textures and methods of making such articles. In particular, metal articles of type described are especially useful as sputtering targets.

Sputtering targets of high purity metals and alloys are widely used in electronics and semiconductor industries for sputtering thin films. It is desirable to obtain large size targets.

SUMMARY OF THE INVENTION

In accordance with the invention there is provided a high purity tantalum article, such as a sputtering target having substantially uniform texture. In particular, the invention comprises a tantalum sputtering target of at least about 99.95% tantalum and a substantially uniform {100} crystallographic orientation.

A process to provide the tantalum sputtering target is disclosed in application Ser. No. 09/098,761 filed on even date herewith, the disclosure of said application is expressly incorporated herein by reference. The process comprises:

1) providing a metal billet;
2) heating the billet to a forging temperature below the recrystallization temperature of the metal;
3) applying a solid lubricant between the ends of the billet to be forged and press plates of a forging machine in which the billet is to be forged to reduce the friction during forging;
4) forging the billet to a desired billet thickness with about 70% to 95% reduction;
5) bringing the forged billet to about room temperature;
6) rolling the billet to plate with a reduction in thickness per rolling pass sufficient to provide near uniform strain distribution; and
7) recrystalization annealing the plate.

It is also advantageous to machine shallow pockets in both ends of the billet ends prior to applying the solid lubricant of sufficient thickness. Preferably, the billet is forged at a temperature below the minimum temperature of static recrystallization and then rolled and annealed at a time and temperature to provide the beginning stage of static recrystallization.

The rolling reduction per pass is desirably in accordance with a relationship of the minimum reduction per pass, the roll diameter and the desired billet thickness after forging. Generally, the reduction per pass during rolling is about 10% to 20% per pass.

Another embodiment the invention comprises a metal article, such as a sputtering target, having a near-to-minimum of statically crystallized grain size, and uniform texture.

The present process can be applied to different metals and alloys that display good ductility and workability at temperatures below corresponding temperatures of static recrystallization. Among metals with which the invention can be applied are Al, Ti, Ta, Cu, Nb, Ni, Mo, Au, Ag, Re, Pt and other metals, as well as their alloys. One embodiment of the method comprises the steps of processing an ingot to a semi-finished billet, including, for example, melting, ingot casting, homogenizing/solutionizing heat treatment, hot working to break down the cast structure, and billet preparation followed by billet shaping and thermomechanical treatment to fabricate a product, for example a sputtering target, and refine the metallurgical structure and produce a desired texture. By one embodiment of the process of the invention, cold/warm working and annealing are used to develop extremely fine, uniform structures and strong, uniform textures that result in improvement in performance of sputtering targets.

DETAILED DESCRIPTION

Figure 1:
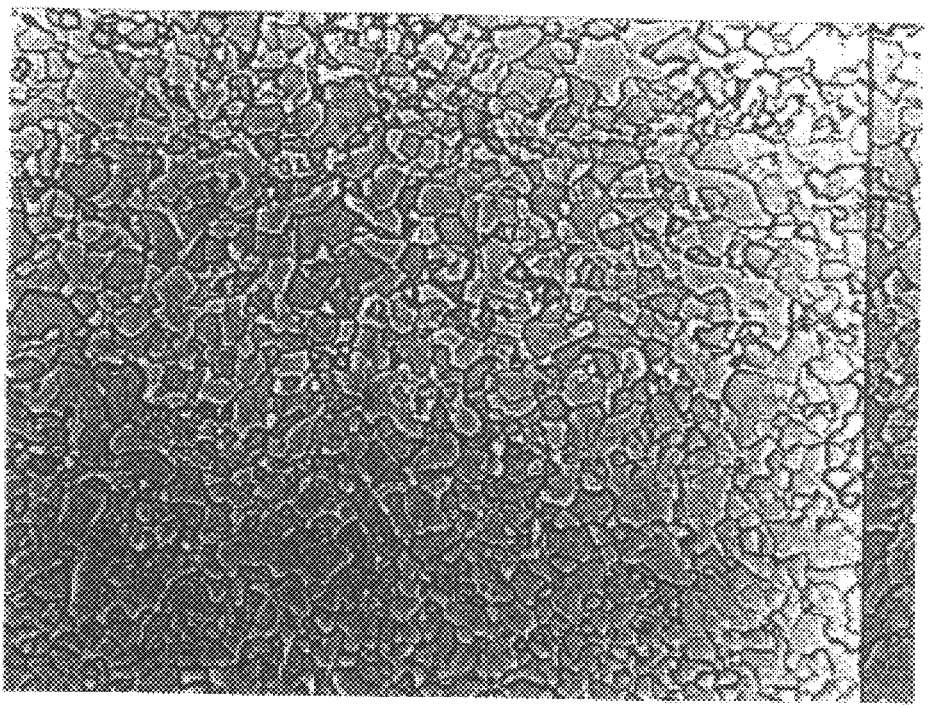
FIG. 1 is a photomicrograph showing grain structure of tantalum target; center location on target, 100×25 microns.

To optimize thermomechanical treatment, it is desirable to attain intensive and uniform strains before recrystallization annealing. Typically, targets are thin discs fabricated from a single billet processed by rolling or upsetting-forging operations. In both cases, an original billet length (Ho) is reduced to a final thickness (h) and an average strain may be calculated by the formula:

$$\epsilon = (1-h/Ho)100\% = [1-(M/Mo)^{2/3}]\,100\% \tag{1}$$

where Mo=Ho/Do and M=h/d are height-to-diameter ratios of the original billet and the worked product, correspondingly. The final ratio (M) is prescribed by the desired target shape and is usually in the range of from M=0.07 to M=0.5, while the original billet ratio Mo may be in the range of from about 1.86 to 0.5 and yields limits of strain shown in previously described equation (1) as follows:

$$73\% < \epsilon < 95\% \tag{2}$$

Strain in equation (2) is high enough to optimize static recrystallization only for thin targets. But even for these targets non-uniformity in strain distribution through a billet volume may significantly reduce the amount of strain in some areas. Also, demands on capacity of a forging press or rolling mill necessary to provide strains of equation (2) above for large target billets may be too high for some applications. Therefore, there may be restrictions on attainable strains by rolling or forging operations.

Rolling is most suitable for processing to produce thin and large targets. But the original billet ratio (Mo) advantageously should be less than 1, otherwise the end effect during rolling of long cylindrical billets develops very strong non-uniformity in strain distribution. In addition, to provide near uniform strains even for thin billets, the roll diameter advantageously should be significantly larger than the billet thickness and the number of reductions per pass can influence the result. Because of the foregoing, rolled billets may have concave-like shapes with maximum strain at contact surfaces and minimum strains at the middle billet section that are not sufficient to optimize recrystallization and develop most useful structures. Recently published Japan Patent No 08-269701 describes a titanium target manufactured by intensive cold rolling of sheet from stock and low temperature annealing. However, this technology cannot be applied to plates and although fine grain size is described for some target parts, the Japanese patent data shows large deviation in grain diameters.

Strain non-uniformity from forging is much stronger than for rolling. Because of contact friction, extensive "dead metal" zones are present at the central billet area. This results in low strains inside these zones and high pressure and load for thin billets. Upsetting bulk targets from a large billet with a large thickness-to-diameter ratio requires very powerful presses and expensive tools but cannot produce products with uniform grain diameters. That is why the forging operation is mostly used for hot breakdown of cast ingots only.

One attempt to overcome these problems is described in Japanese Patent No 08-232061. The patent describes a combination of forging and rolling for titanium targets at temperatures below the temperature of phase transformation. The process uses a temperature below the phase transformation temperature but well above the temperature of static recrystallization for heavy worked materials. As a result, the process cannot optimize recrystallization and develop very fine and uniform structures/textures.

In contrast to the foregoing, the present invention includes:

1) performing the forging step as frictionless upsetting to provide stress-strain uniformity and intensive working without material cracking and press over-loading; and
2) performing the forging step at temperatures below the minimum temperature of static recrystallization for corresponding conditions to provide the finest and most uniform structures/textures. The steps of forging, rolling and annealing can be optimized to provide cost-effective processing and target performance.

The original billet has a cylindrical shape and a volume and length-to-diameter ratio Mo. Cold upsetting is preferable, but in some cases preheating of the billet and tool to a temperature below the temperature of static recrystallization may be used to reduce working pressure and load. Two thin sheets of solid lubricant (3) are placed between the billet end and forging plate (4) mounted in a press. It has been found that best results are obtained with lubricant polymers that exhibit visco-elastic behavior at working conditions, such as polyethylene, polytetrafluroethylene or polyurethane.

In accordance with the present invention, visco-elastic polymer film is used to entirely separate the billet and tool. During upsetting, the polymer flows into contact with the billet. It has been found that with the invention the original billet ratio (Mo) may be as large as Mo=1.86, and the polymer lubricant film enables partial reductions of up to 75%. Because of increase of the original billet ratio Mo=1.86, the limits for attainable strain (see equation (1) are much better than (2)

$$87\% < \epsilon < 95\% \quad (3)$$

that in conjunction with uniform strain distribution allows one to optimize recrystallization in most cases. Also, thin billet after forging (up to M=0.16) provides the best conditions for following rolling.

The preliminary forged billet is rolled for further reduction of thickness. Cold or warm rolling may be used. Rolling may be performed in two or four mutually perpendicular directions to produce a product with a circle-like shape. It is important to provide the most uniform strain distribution during rolling by controlling roll diameter-to-billet thickness ratios (ϕ/H), billet thickness-to-diameter ratio (M) and reductions per pass. An important aspect is to prevent buckling along the free surface of a cylindrical billet at the beginning of rolling. It has been found that buckling area (T) is approximately equal to a billet-roll contact length (L), and buckling is eliminated if contact length exceeds a billet thickness h1 after the first pass. In other words, if L>H, then $$\phi/H \geq \frac{4(1-\epsilon)^2 + \epsilon^2}{2\epsilon} \quad (4)$$

where ϕ is the roll diameter, $\epsilon=(1-h/H)$ 100% is rolling reduction per pass. Calculations with formula (4) for different reductions are shown in Table 1.

TABLE 1

| ε | 5% | 10% | 15% | 20% | 25% |
|---|---|---|---|---|---|
| ϕ/H | 36 | 16 | 9.7 | 6.5 | 4.6 |

As can be seen, at an average reduction of 15% or less, the roll diameter should be at least about 10 times (9.7 in Table 1) as large as the cylindrical billet thickness. On the other hand, use of thin billets for rolling without upsetting reduces possible reductions (1). Conventional target rolling suffer from both disadvantages, that is, non-uniform and low reductions are equally unacceptable to optimize structure. In the present invention high ratios of roll diameter-to-billet thickness (ϕ/H) are provided by preliminary billet upsetting to the necessary thickness (H). Simultaneously the upsetting operation provides a pre-rolling billet ratio (m) of less than about 0.5 that is useful to attain uniform rolling reductions along a billet. Partial rolling reductions from about 10% to 20% per pass are also useful for near uniform strain distribution in the final product. Rolling reductions lower than about 10% develop higher strains at billet surfaces while reduction more than about 18% develop higher strains at billet middle section. All these parameters define the best embodiments for performing upsetting and rolling for targets for optimum results.

The last step in target processing is recrystallization annealing. For many metals and alloys, strains from equation (3) are enough to optimize static recrystallization. To attain this goal, first the lowest temperature necessary to start static recrystallization, and then the shortest time necessary to complete that at all billet volume should be determined. Corresponding structures have the minimum grain sizes and the lowest dispersions of grain diameters inside each local area. As the present method also provides uniform strains at any part of the billet, the minimum temperature of static recrystallization may be realized as the optimal temperature for the whole billet at the shortest time. This results in very fine and uniform structures and strong, uniform texture for the target produced.

Another embodiment of the invention is preforming forging in a few steps with successive decrease a billet thickness and resumption of film lubricant at each step. That way forging may be prolonged to low billet thickness without distortion of frictionless conditions and strain uniformity under relative low pressure and load. If forging is continued to the final target thickness without rolling, corresponding forging textures are provided for targets. Similarly, in the special cases rolling may be performed without forging with near uniform strain distribution in accordance with the invention.

The following example illustrates one embodiment of the invention.

High purity tantalum (99.95% and higher) in the form of billets of about 178 mm length and about 100 mm were used.

The composition of the resulting tantalum target is shown in Table 2, the target comprising 99.95% tantalum and balance as shown in the table.

TABLE 2

| ELEMENT | TYPICAL | ELEMENT | TYPICAL |
|---------|---------|---------|---------|
| C  | 10    | Ca | <5  |
| O  | 15    | Fe | 15  |
| N  | 15    | Mg | <5  |
| H  | <5    | Mn | 40  |
| K  | 0.001 | Mo | 40  |
| Li | 0.001 | Nb | 150 |
| Na | 0.001 | Ni | <5  |
| Al | <5    | Si | 15  |
| B  | 2     | Sn | <5  |
| Cu | <5    | Ti | 5   |
| Co | <5    | W  | 25  |
| Cr | <5    | Zr | <5  |

Reported in ppm.
C, O, N and H by LECO analysis.
Na, Li and K by SIMS analysis.

Metallic elements by ICP (inductively Coupled Plasma). or GDMS (Glow Discharge Mass Spectroscopy) analysis. Billets were upset-forged at room temperature to a thickness of 75 mm. Teflon films of 150×150 mm2 and thickness of 1.2 mm were used as lubricants for frictionless upsetting (alternatively frictionless upset-forging can also be performed at 300 deg. C.). Thereafter cold rolling with a roll diameter of 915 mm was performed in sixteen passes with partial reductions of 12% per pass along four directions under an angle of 45°.

Figure 2:
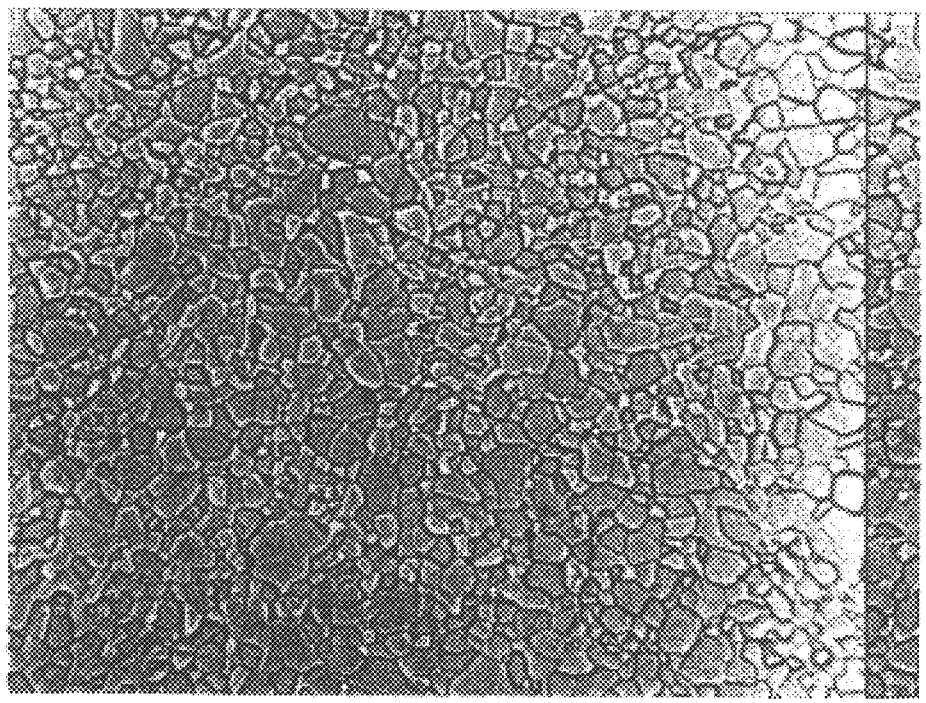
FIG. 2 is a photomicrograph showing grain structure of tantalum target; mid-radial location on target, 100×25 microns.
Figure 3:
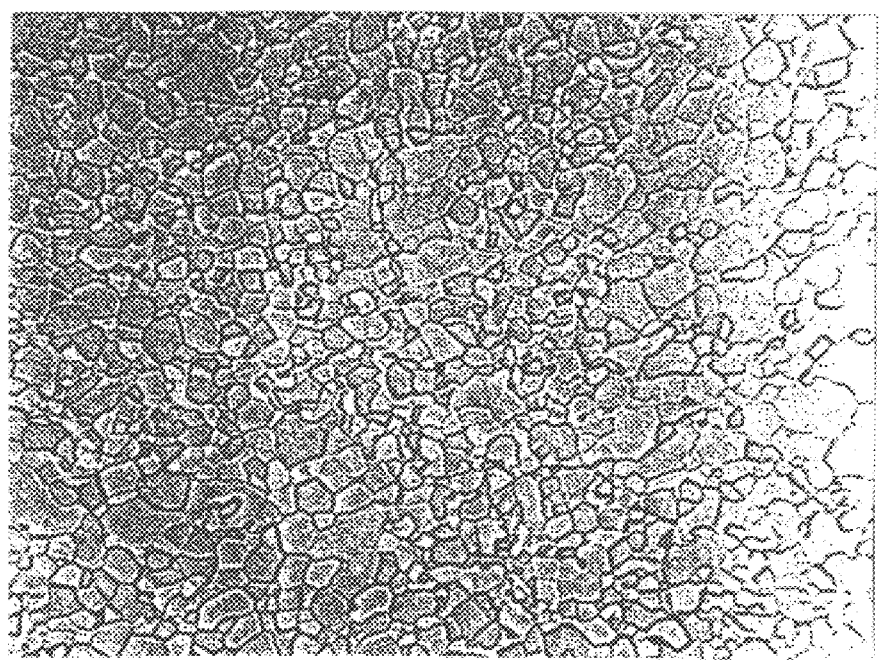
FIG. 3 is a photomicrograph showing grain structure of tantalum target; edge location on target, 100×25 microns.
Figure 4:
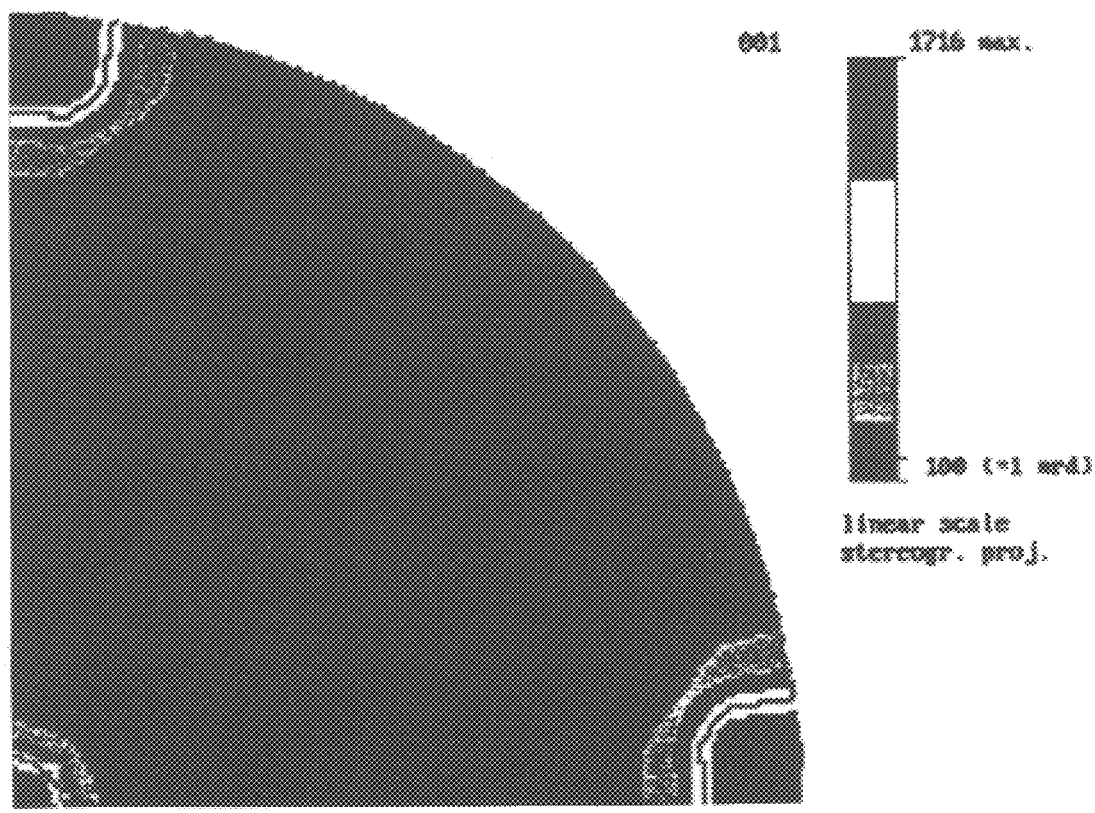
FIG. 4 is an inverse pole figure showing {100} cubic texture; center location.
Figure 5:
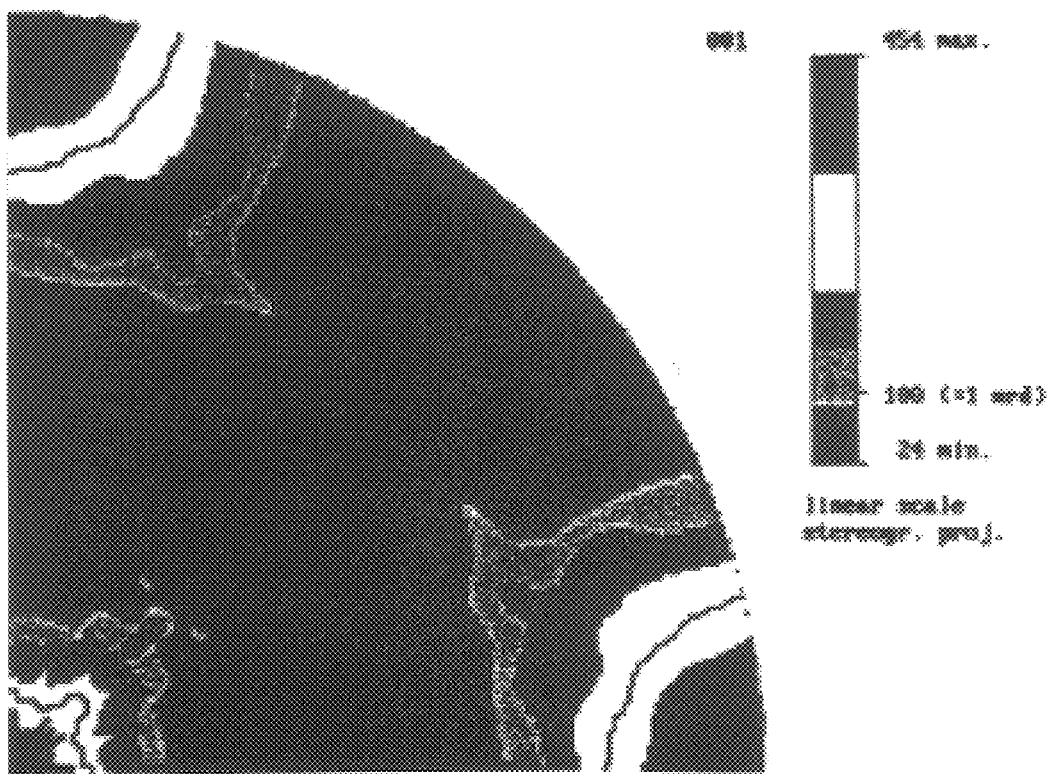
FIG. 5 is an inverse pole figure showing {100} cubic texture; mid-radial location.
Figure 6:
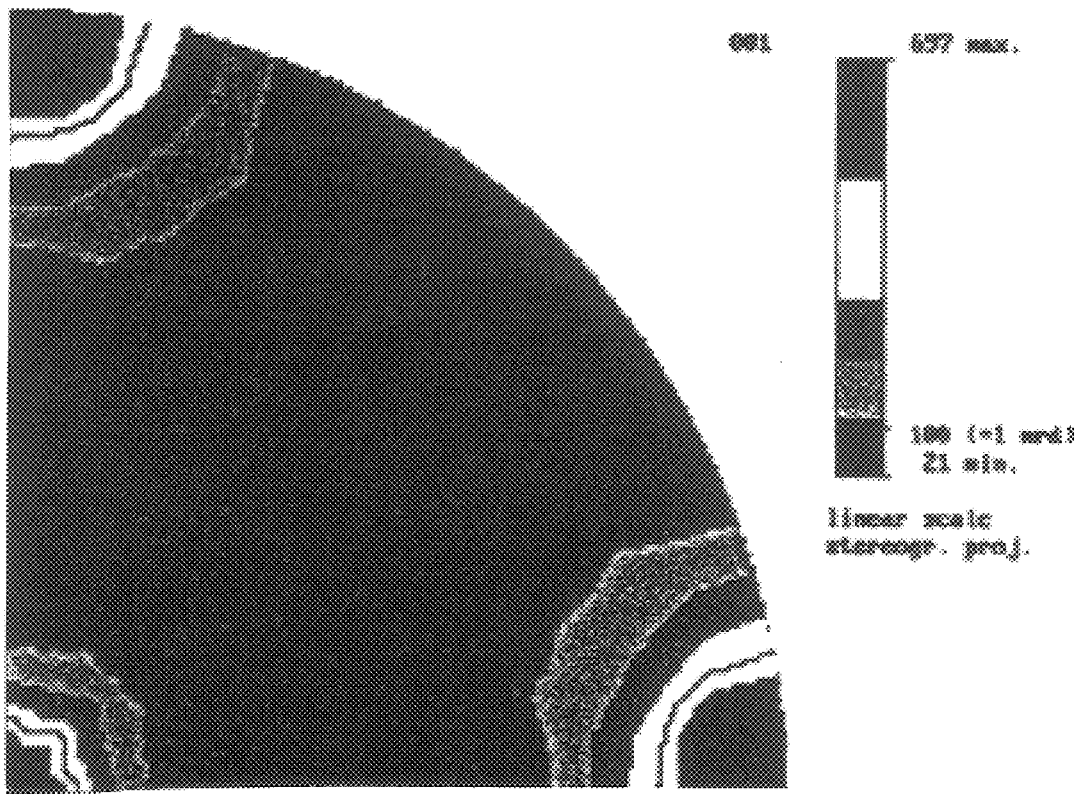
FIG. 6 is an inverse pole figure showing {100} cubic texture; edge location.

Coupons across the thickness of the rolled billet were cut from central, mid-radius and external areas and annealed at different temperatures during 1 hours (h and investigated for structure and texture and photomicrographs thereof are shown in FIGS. 1–6. FIGS. 1–3 are photomicrographs of the center, mid-radial and edge, respectively, showing the fine grain structure of a tantalum target. FIGS. 4–6 are graphs showing {100} crystallographic orientation at the center, mid-radial and edge.

An important advantage of the invention is the production of very fine and uniform structures and strong uniform textures at any point of a target which formerly could not be attainable. The following are various billet dimensions and processing routes which can be applied to manufacture sputtering targets with uniform microstructures and crystallographic texture. The method provides targets with significant improvement in sputtering target performance.

The following examples are illustrative for various possible starting billet dimensions:

| Billet Height, $H_o$ | 7" | 6" | 4.5 |
| Billet Diameter, $D_o$ | 3.75" | 3.75 | 4.5 |
| $M_o$ | 1.86 | 1.6 | 1 |

Process Flow Steps for different billet dimensions.
Mo=1.86
Step 1: Anneal the billet in vacuum.
Step 2: Upset-forge billet using teflon as a solid lubricant at room temperature or at 572 F. to specific height required for rolling.
Step 3: Fly-cut surfaces of the forged billet.
Step 4: Roll the billet at room temperature to required final thickness.
Step 5: Anneal in vacuum to obtain a fine grain size and uniform texture.

Alternate route for Mo=1.86
Step 1: Upset-forge using teflon to a height such that Mo=1.0.
Step 2: Vacuum anneal the forged billet.
Step 3: Upset-forge billet using teflon to a final height as required for rolling operation.
Step 4: Fly-cut the surfaces of the forged billet.
Step 5: Roll the billet at room temperature to the required final thickness.
Step 6: Vacuum anneal the rolled target blank in vacuum to obtain fine grain size and uniform texture.

Mo=1.6
Step 1: Anneal the billet in vacuum.
Step 2: Upset-forge billet uisng teflon as a solid lubricant at room temperature or at 572 F. to a required final height suitable for rolling.
Step 3: Fly-cut surfaces of the forged billet.
Step 4: Roll the billet at room temperature to required final thickness.
Step 5: in vacuum to obtain a fine grain size and uniform texture.

MoO=1.0
Step 1: Anneal the billet in vacuum.
Step 2: Upset-forge billet uisng teflon as a solid lubricant at room temperature or at 572 F.
Step 3: Fly-cut surfaces of the forged billet.
Step 4: Roll the billet at room temperature to required final thickness.
Step 5: Anneal in vacuum to obtain a fine grain size and uniform texture.

The following illustrates one embodiment of the process to obtain tantalum (a 99.95 or higher purity) target blank with a maximum grain size less than 50 microns and a uniform crystallographic texture of {100} across the face and through the thickness of the target.

1) working a billet during thermomechanical processing by combining the frictionless upset forging and rolling;
2) frictionless forging during upsetting operation that develops positive friction along contact surfaces and increases process stability;
3) predetermine parameters of upsetting operation to increase accumulated strains, reduce press capacity and enable effective rolling;
4) predetermine parameters of rolling conditions to enable near uniform strain distribution and cylindrical shape (for sputtering targets) of the product;
5) using as the annealing temperature the lowest temperature of static recrystallization; and
6) producing a sputtering target with very fine and uniform structures and uniform strong textures not previously attainable.

It is apparent that various changes and modifications can be made without departing from the invention. Accordingly, the scope of the invention should be limited only by the appended claims, wherein:

What is claimed is:

1. A tantalum sputtering target comprising at least about 99.95 weight percent tantalum and a substantially uniform {100} crystallographic orientation across a surface of the target.

2. The tantalum sputtering target of claim 1 further comprising a maximum tantalum grain size of less that 50 microns at the target surface.

3. The tantalum sputtering target of claim 1 further comprising an average grain size of about 25 microns.

4. The tantalum sputtering target of claim 1 produced from a frictionless forged billet.

5. The tantalum sputtering target of claim 1 having a thickness; and wherein the sputtering target comprises the substantially uniform {100} crystallographic orientation throughout the thickness.

6. The tantalum sputtering target of claim 1 further comprising an average tantalum grain size of less than 50 microns at the target surface.

7. A sputtering target comprising at least about 99.95 weight percent tantalum and a maximum grain size of less than 50 microns.

8. The sputtering target of claim 7 produced from a frictionless forged billet.

9. A tantalum sputtering target comprising an average grain size of about 25 microns.

10. The tantalum sputtering target of claim 9 comprising a maximum grain size of less than 50 microns.

11. A sputtering target comprising at least about 99.95 weight percent tantalum; the sputtering target having a thickness, and a maximum grain size of less than 50 microns throughout the thickness; the sputtering target also comprising a substantially uniform {100} crystallographic orientation throughout the thickness.

12. The tantalum sputtering target of claim 11 comprising an average tantalum grain size of less than 50 microns throughout the thickness.

13. A sputtering target comprising at least about 99.95 weight percent tantalum and an average grain size of less than 50 microns.

14. The tantalum sputtering target of claim 13 produced from a frictionless forged billet.

15. A sputtering target comprising at least about 99.95 weight percent tantalum and an average grain size of less than about 25 microns.

* * * * *

UNITED STATES PATENT AND TRADEMARK OFFICE
CERTIFICATE OF CORRECTION

PATENT NO. : 6,348,139 B1
DATED : February 19, 2002
INVENTOR(S) : Ritesh P. Shah et al.

It is certified that error appears in the above-identified patent and that said Letters Patent is hereby corrected as shown below:

<u>Column 6,</u>
Line 24, replace "MoO=1.0" with -- Mo=1.0 --

Signed and Sealed this

Eighth Day of October, 2002

*Attest:*

JAMES E. ROGAN
*Attesting Officer*  *Director of the United States Patent and Trademark Office*

UNITED STATES PATENT AND TRADEMARK OFFICE
CERTIFICATE OF CORRECTION

PATENT NO.    : 6,348,139 B1
DATED         : February 19, 2002
INVENTOR(S)   : Ritesh P. Shah et al.

It is certified that error appears in the above-identified patent and that said Letters Patent is hereby corrected as shown below:

<u>Column 5,</u>
Line 36, replace "during 1 hours (h and investigated for" with -- during 1 hour (h) and investigated for --

<u>Column 6,</u>
Line 16, replace "Upset-forge billet uisng teflon as a solid" with -- Upset-forge billet using teflon as a solid --

Signed and Sealed this

Third Day of December, 2002

JAMES E. ROGAN
*Director of the United States Patent and Trademark Office*